United States Patent
Aro

(10) Patent No.: US 10,364,863 B2
(45) Date of Patent: Jul. 30, 2019

(54) ARRANGEMENT FOR FASTENING A POWER ELECTRONIC DEVICE SUCH AS A FREQUENCY CONVERTER

(71) Applicant: VACON OY, Vaasa (FI)

(72) Inventor: Lasse Aro, Vaasa (FI)

(73) Assignee: Vacon Oy, Vaasa (FI)

( * ) Notice: Subject to any disclaimer, the term of this patent is extended or adjusted under 35 U.S.C. 154(b) by 93 days.

(21) Appl. No.: 15/542,699

(22) PCT Filed: Jan. 12, 2016

(86) PCT No.: PCT/EP2016/050452
§ 371 (c)(1),
(2) Date: Jul. 11, 2017

(87) PCT Pub. No.: WO2016/134868
PCT Pub. Date: Sep. 1, 2016

(65) Prior Publication Data
US 2017/0350469 A1 Dec. 7, 2017

(30) Foreign Application Priority Data
Feb. 26, 2015 (FI) .................. 20155131

(51) Int. Cl.
*H05K 5/00* (2006.01)
*F16F 15/02* (2006.01)
(Continued)

(52) U.S. Cl.
CPC ............ *F16F 15/022* (2013.01); *F16F 15/02* (2013.01); *F16F 15/34* (2013.01); *H05K 5/0008* (2013.01);
(Continued)

(58) Field of Classification Search
CPC ....................................................... H05K 5/00
See application file for complete search history.

(56) References Cited

U.S. PATENT DOCUMENTS 6,751,093 B1 6/2004 Hsu et al.
2009/0069157 A1* 3/2009 Wilhelm ............... A61H 1/003
482/51
2014/0139979 A1 5/2014 Blazic

FOREIGN PATENT DOCUMENTS

CA 2889000 A1 5/2014
CN 203451468 U 2/2014
(Continued)

OTHER PUBLICATIONS

International Search Report for PCT Serial No. PCT/EP2016/050452 dated Apr. 14, 2016.

*Primary Examiner* — Jacob B Marks
(74) *Attorney, Agent, or Firm* — McCormick, Paulding & Huber LLP

(57) ABSTRACT

An arrangement for fastening, at multiple fastening points, a power electronic device such as a frequency converter (1) to a base (2) susceptible to vibration, at least a portion of which fastening points are vibration-damped, and which fastening points are on two opposite sides of the frequency converter (1). The invention is realized such that there are at least two fastening points (3, 4; 3, 4, 5) on each of two opposite sides of the frequency converter (1), wherein fastening points (3, 4, 5) on one side are damped while fastening points (3, 4) on the other side are undamped.

9 Claims, 1 Drawing Sheet

(51) Int. Cl.
*H05K 5/02* (2006.01)
*H05K 7/14* (2006.01)
*F16F 15/34* (2006.01)

(52) U.S. Cl.
CPC ......... *H05K 5/0204* (2013.01); *H05K 5/0226* (2013.01); *H05K 7/1432* (2013.01)

(56) References Cited

FOREIGN PATENT DOCUMENTS

| | | | |
|---|---|---|---|
| CN | 103802762 A | 5/2014 |
| DE | 10 2008 043 899 A1 | 6/2009 |
| JP | 2005106140 A | 4/2005 |
| JP | 2014095441 A | 5/2014 |

* cited by examiner

ARRANGEMENT FOR FASTENING A POWER ELECTRONIC DEVICE SUCH AS A FREQUENCY CONVERTER

CROSS-REFERENCE TO RELATED APPLICATIONS

This application is a National Stage application of International Patent Application No. PCT/EP2016/050452, filed on Jan. 12, 2016, which claims priority to Finnish Patent Application No. 20155131, filed on Feb. 26, 2015, each of which is hereby incorporated by reference in its entirety.

TECHNICAL FIELD

The present invention relates to an arrangement for fastening a power electronic device such as a frequency converter to a base thereof.

BACKGROUND

The invention relates to the fastening of small plastic-framed power electronic devices, in particular frequency converters, to a base thereof. When devices are mounted in places susceptible to vibration, such as factories or various vehicles, the vibration resistance of the devices becomes a problem, because electronic devices are often liable to be damaged by vibration. Ships are especially difficult mounting sites as far as vibration is concerned. In this case the way in which fastening is accomplished is of decisive significance. The term "small devices" used herein means devices of, for example, about 40 kg or less. A test requirement is, for example, that the vibration amplification factor is not allowed to exceed 10 (DNV 2.4a, x-, y-, z-directions 0.7 g).

A known approach in the fastening of a device to a vibrating base is to use, for example, "cup mount"-type damping fasteners made by Fabreeka. Such a damping fastener contains an elastic plate between two metal cups which are positioned one above the other, and this entity is fastened to a base by four screws and to the device by one screw. Such damping fasteners are stocked on shop shelves and thus readily available, but on the other hand are expensive and difficult to mount due to the multiple screw fastenings.

SUMMARY

The object of the present invention is to realize a novel arrangement, by means of which the drawbacks of known solutions are avoided and a reliable and cost-efficient fastening system is achieved for fastening a power electronic device such as a frequency converter to a vibrating base.

This object is achieved by means of the method and apparatus according to the invention, which are characterized by an arrangement for fastening, at multiple fastening points, a power electronic device such as a frequency converter to a base susceptible to vibration, at least a portion of which fastening points are vibration-damped, and which fastening points are on two opposite sides of the frequency converter, in that there are at least two fastening points on each of two opposite sides of the frequency converter, wherein fastening points on one side are damped while fastening points on the other side are undamped. Other advantageous embodiments of the invention are the subject of the dependent claims.

The damping concept according to the invention for small power electronic devices such as frequency converters is eccentric, such that vibration is damped on only one side of the frequency converter. On the other side it is fastened rigidly without damping in the most critical direction of sideways vibration. Thus the rigidly fastened side becomes a turning point or axle for the vibrating frequency converter, and since this turning axle is at a different point from the centre of gravity in a sideways direction, sideways motion becomes a two-component motion direction. The frequency converter also moves in a forwards-backwards direction and the natural frequency is different in the two components, as a result of which the natural frequency of one component is damped.

Benefits of the invention include very easy mounting, because only four screw fastenings are needed instead of the previous 20. The fastening elements used in the invention are also cheap in price. Thus, by means of the invention, sufficient damping of vibration even for demanding applications is achieved very simply and cheaply. Compared with a conventional mounting fashion, the vibration amplification factor has been found to decrease at the point of the resonance peak from a value of about 15 to a value of about 5, which is easily sufficient to pass the standard requirement.

BRIEF DESCRIPTION OF THE DRAWINGS

The invention is explained in further detail below with the aid of examples relating to advantageous embodiments, by referring to the accompanying drawings, in which.

DETAILED DESCRIPTION

Figure 1:
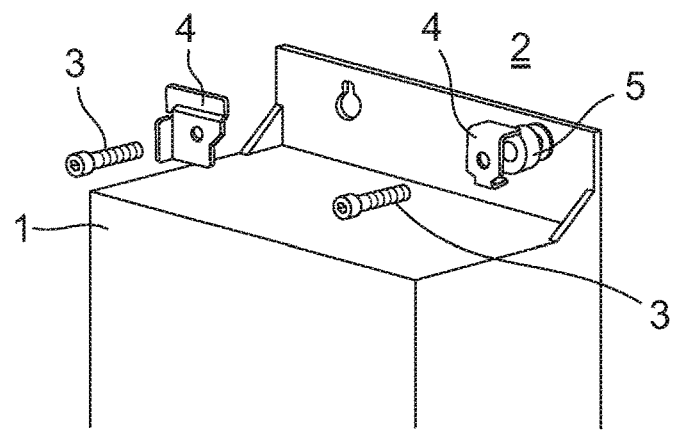
FIG. 1 shows the fastening of an upper edge of a frequency converter in an exploded view.

FIG. 1 shows the fastening of an upper edge of a power electronic device, for example a frequency converter 1, to a base 2 thereof according to the present invention. The base may be any object to which the frequency converter is to be fastened. For this purpose there are two holes in the upper edge of the frequency converter, through which holes two screws 3 are screwed into holes (not shown) in the base. Between the screw head and the upper edge is mounted a base plate 4, which may be designed such that it shape-locks the upper edge of the frequency converter to the base 2 when the screws are tightened. The frequency converter 1 is advantageously rectangular in shape when viewed from above.

As can be discerned from FIG. 1, between the base plate 4 at the right-hand fastening point and the upper edge of the frequency converter is further mounted a damping bush 5, which is made of a soft damping material such as silicon-based Sylomer SR220.

Figure 2:
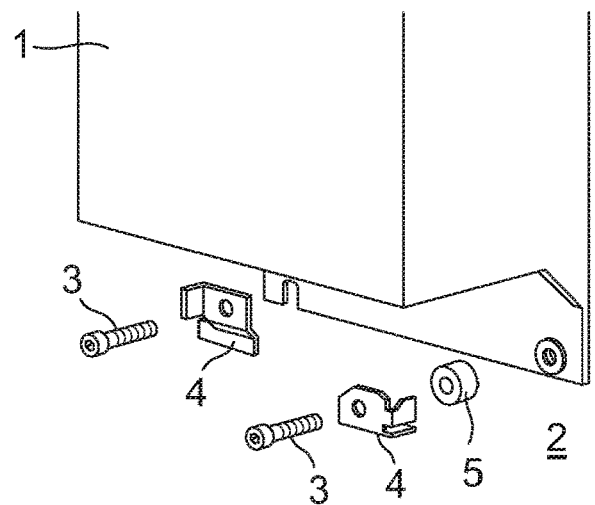
FIG. 2 shows the fastening of a lower edge of a frequency converter in an exploded view.

FIG. 2 shows the fastening of a lower edge of the same frequency converter 1 to the base 2. Fastening is accomplished in the same way as in the upper edge, i.e. by screws 3 and base plates 4. Again, between the right-hand base plate and the fastening hole (lower edge) is mounted a damping bush 5, which is advantageously of the same kind as the damping bush used in the fastening of the upper edge.

Figure 3:
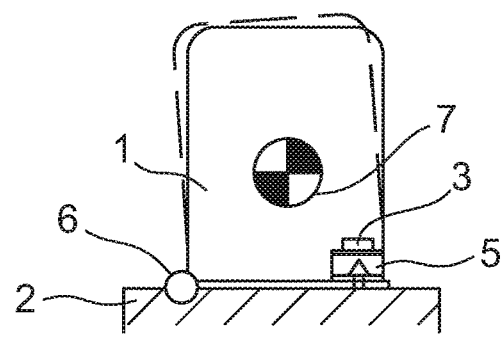
FIG. 3 shows the fastening of a frequency converter as viewed from one end.

Thus, in the invention, a frequency converter or other power electronic device, which is susceptible to vibration arising from a mounting site, is fastened at its corners or near to its corners by four screws 3, wherein fastening of the screws on one side is damped by the damping bush 5 while fastening of the screws on the other side is undamped. Thus, since the frequency converter is fastened on one side, it begins to turn, under the action of vibration, so that the rigid fastening acts as a turning point 6 or as a turning axle, as shown by the dotted line in FIG. 3. Sideways motion is thus composed of two components: upwards and to the side. The upwards-directed component has a different natural frequency from the sideways component, and for this reason the upwards-directed component acts as a damper for the sideways component. The phenomenon occurs because the damped side permits upwards-directed motion.

An eccentric damping concept for small power electronic devices such as frequency converters 1 is thus realized in the invention. Vibration is damped on only one side of the frequency converter. On the other side it is fastened rigidly without damping in the most critical direction of sideways vibration. Thus the rigidly fastened side becomes a turning point 6 or axle for the vibrating frequency converter, and since this turning axle is at a different point from the centre of gravity 7 in a sideways direction, sideways motion becomes a two-component motion direction, as explained above.

It will be clear to a person skilled in the art that the invention is not limited to the embodiment examples presented above, but can vary within the scope of the accompanying claims. The invention is primarily intended for the fastening of small plastic-framed power electronic devices, for example of less than 40 kg. Large devices require more fastening screws 3, so the invention does not apply to the mounting of such devices. An advantageous application of the invention is for example a rectangular frequency converter comprising four fastening points, one at or near each corner of the device. There could even be more than two fastening points on both opposite sides, and the number thereof need not be the same on both sides. Thus there could be for example two fastening points on one side and three fastening points on the other side.

Distinguishing features which may have been presented together with other distinguishing features herein may also be used independently of each other as required.

What is claimed is:

1. An arrangement for fastening, at multiple fastening points, a frequency converter to a base susceptible to vibration, at least a portion of which fastening points are vibration-damped, and which fastening points are on two opposite sides of the frequency converter, wherein there are at least two fastening points on each of two opposite sides of the frequency converter, wherein fastening points on one side are damped while fastening points on the other side are undamped.

2. The arrangement according to claim 1, wherein the undamped fastening points include a screw and a base plate, which screw is screwed tightly into the base, and the damped fastening points include a screw, a base plate and a damping bush, which screw is screwed tightly into the base.

3. The arrangement according to claim 1, wherein there are two damped fastening points and two undamped fastening points.

4. The arrangement according to claim 2, wherein the frequency converter is substantially in the shape of a rectangle when viewed from above, and the fastening points are located at corners of the rectangle or in the immediate vicinity of the corners.

5. The arrangement according to claim 2, wherein the material of the damping bush is silicon-based Sylomer SR220.

6. The arrangement according to claim 2, wherein there are two damped fastening points and two undamped fastening points.

7. The arrangement according to claim 3, wherein the frequency converter is substantially in the shape of a rectangle when viewed from above, and the fastening points are located at corners of the rectangle or in the immediate vicinity of the corners.

8. The arrangement according claim 3, wherein the material of the damping bush is silicon-based Sylomer SR220.

9. The arrangement according claim 4, wherein the material of the damping bush is silicon-based Sylomer SR220.

* * * * *